(12) United States Patent
Kamins et al.

(10) Patent No.: US 8,154,127 B1
(45) Date of Patent: Apr. 10, 2012

(54) OPTICAL DEVICE AND METHOD OF MAKING THE SAME

(75) Inventors: Theodore I. Kamins, Palo Alto, CA (US); Alexandre M. Bratkovski, Mountain View, CA (US); Shashank Sharma, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1092 days.

(21) Appl. No.: 11/829,995

(22) Filed: Jul. 30, 2007

(51) Int. Cl.
  *H01L 23/48* (2006.01)
(52) U.S. Cl. ............. 257/746; 257/471; 257/E33.054; 438/92; 438/167; 438/570
(58) Field of Classification Search ........... 350/96.12; 372/44.01; 257/758, E31.084, E31.099, 257/E31.105, E31.115, E33.054, E33.058, 257/536, 734, 213, 471, 746; 216/2; 438/92, 438/167
See application file for complete search history.

(56) References Cited

U.S. PATENT DOCUMENTS

| | | | |
|---|---|---|---|
| 4,608,581 A | 8/1986 | Bagratishvili et al. | |
| 4,845,535 A | 7/1989 | Yamanishi et al. | |
| 4,896,931 A * | 1/1990 | Khurgin | 385/129 |
| 5,097,299 A | 3/1992 | Donhowe et al. | |
| 5,630,741 A | 5/1997 | Potter | |
| 5,949,182 A | 9/1999 | Shealy et al. | |
| 6,130,466 A | 10/2000 | Schneider et al. | |
| 6,770,497 B2 | 8/2004 | Ihm | |
| 6,974,945 B2 | 12/2005 | Matsuo et al. | |
| 6,995,401 B2 | 2/2006 | Yamada et al. | |
| 7,119,373 B2 | 10/2006 | Velez et al. | |
| 2004/0213307 A1 * | 10/2004 | Lieber et al. | 372/39 |
| 2005/0040432 A1 | 2/2005 | Feng et al. | |
| 2005/0082673 A1 * | 4/2005 | Fujiwara et al. | 257/758 |
| 2005/0133476 A1 * | 6/2005 | Islam et al. | 216/2 |
| 2006/0076644 A1 * | 4/2006 | Meyer et al. | 257/536 |
| 2006/0097389 A1 * | 5/2006 | Islam et al. | 257/734 |
| 2007/0085155 A1 | 4/2007 | Borghetti et al. | |
| 2007/0228421 A1 * | 10/2007 | Shioya et al. | 257/213 |
| 2007/0290370 A1 * | 12/2007 | Sharma et al. | 257/784 |

* cited by examiner

*Primary Examiner* — Matthew E Warren
*Assistant Examiner* — Fang-Xing Jiang

(57) ABSTRACT

An optical device includes a first electrode of a first conductivity type, and a second electrode of a second conductivity type. A nanowire is positioned between the first and second electrodes. The nanowire has at least two segments and a junction region formed between the at least two segments. One of the segments is the first conductivity type and the other of the segments is the second conductivity type. At least one of the at least two segments has a predetermined characteristic that affects optical behavior of the junction region.

19 Claims, 2 Drawing Sheets

OPTICAL DEVICE AND METHOD OF MAKING THE SAME

BACKGROUND

The present disclosure relates generally to optical device(s) and method(s) for making the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowires are included in the category of nano-scale structures.

Nanowires are wire-like structures having at least one linear dimension (e.g., diameter) ranging from about 3 nm to about 200 nm. Nanowires are suitable for use in a variety of applications, including functioning as conventional wires for interconnection applications or as semiconductor devices. Nanowires are also the building blocks of many potential optical nano-scale devices, such as light emitting diodes (LEDs), nanowire-based fiber optic devices, optical sensors, and display screens, to name a few.

BRIEF DESCRIPTION OF THE DRAWINGS

Features and advantages of embodiments of the present disclosure will become apparent by reference to the following detailed description and drawings, in which like reference numerals correspond to similar, through not necessarily identical, components. For the sake of brevity, reference numerals or features having a previously described function may not necessarily be described in connection with other drawings in which they appear.

DETAILED DESCRIPTION

Embodiment(s) of the optical device, the method of making the optical device, and the optical system, as disclosed herein, advantageously include and/or use nanoscale connections (i.e., junction regions) to emit light. In an embodiment, the device includes a reflective layer, which is believed to contribute to enhanced light collection. In another embodiment, the device includes a non-linear material, which is believed to absorb photons of one wavelength and emit photons of another wavelength. The optical devices disclosed herein may also advantageously be integrated with conventional silicon circuitry.

Figure 1:
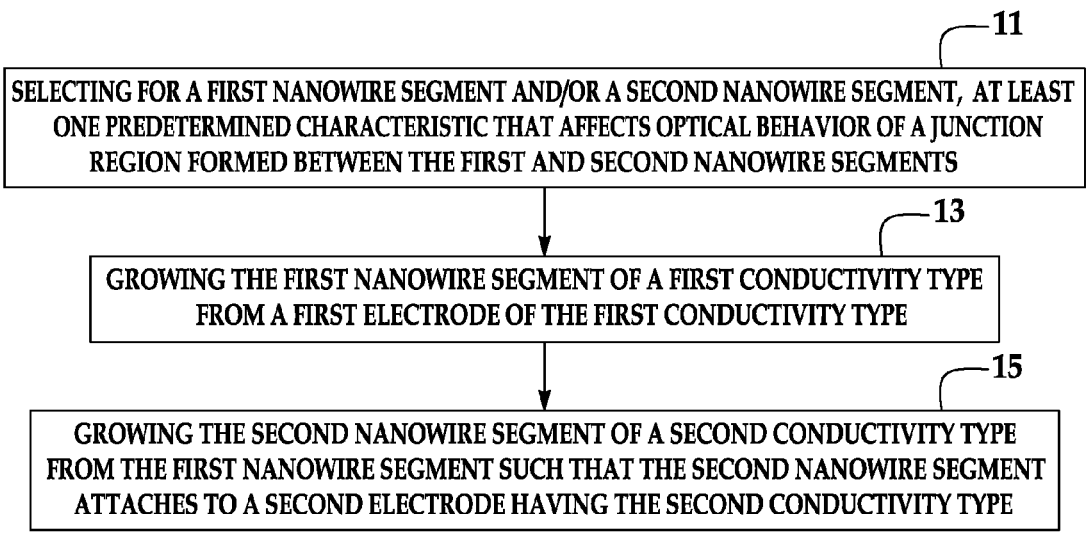
FIG. 1 is a flow diagram depicting an embodiment of a method of forming an optical device.

Referring now to FIG. 1, an embodiment of a method of forming the optical device is depicted. The method includes selecting, for a first nanowire segment and/or a second nanowire segment, at least one predetermined characteristic that affects the optical behavior of a junction region formed between the first and second nanowire segments, as shown at reference numeral 11. The method further includes growing the first nanowire segment of a first conductivity type from a first electrode of the first conductivity type, as shown at reference numeral 13; and growing the second nanowire segment of a second conductivity type from the first nanowire segment such that the second nanowire segment attaches to a second electrode having the second conductivity type, as shown at reference numeral 15. The resulting optical device has first and second nanowire segments, one or both of which include the at least one predetermined characteristic. It is to be understood that this and other embodiments of the method and device are described in further detail in reference to the other figures hereinbelow.

As used herein, the term "junction region" refers to the metallurgical junction, the depletion region, and portions of the neutral region with significant excess minority carriers on each side of the depletion region. In a long-base diode, the junction region includes the metallurgical junction, the depletion region, and about three minority carrier diffusion lengths on each side of the depletion region.

Figure 2:
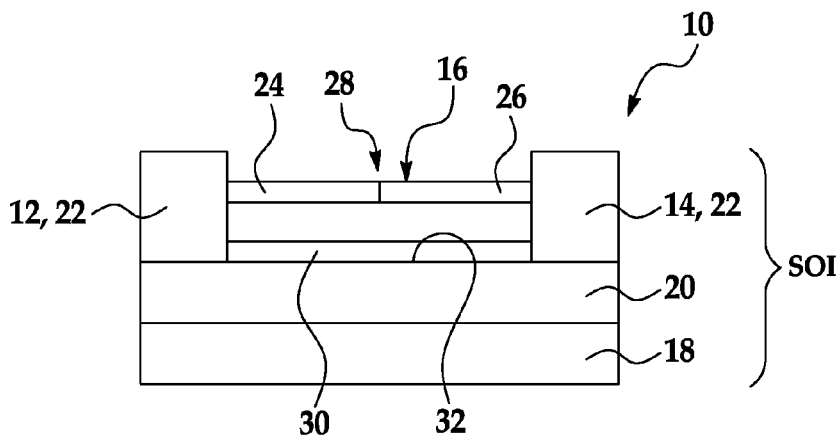
FIG. 2 is a schematic view of an embodiment of the optical device.
Figure 3:
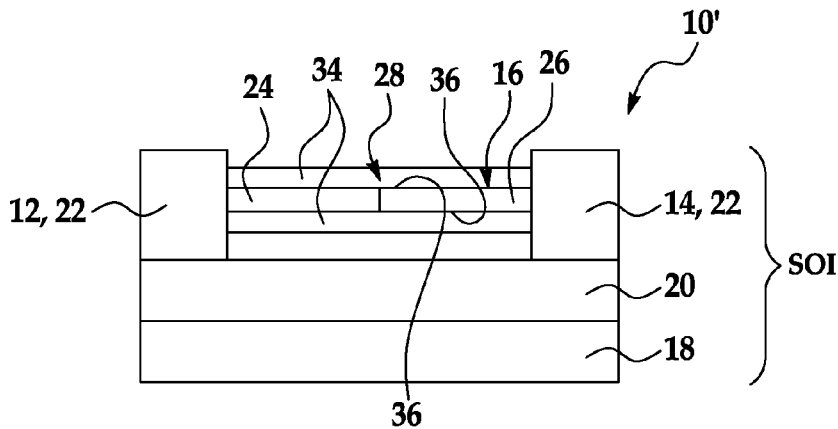
FIG. 3 is a schematic view of another embodiment of the optical device.

Referring now to FIGS. 2 and 3 together, each of the embodiments of the device 10, 10' shown in these figures includes a first electrode 12 of a first conductivity type, a second electrode 14 of a second conductivity type, a nanowire 16 (having segments 24, 26) positioned between the first and second electrodes 12, 14, and a junction region 28 formed between the two nanowire segments 24, 26. Generally, the junction region 28 is capable of emitting light when a voltage is applied between the electrodes 12, 14. As a non-limiting example, the actual junction between the segments 24, 26 may be a p-n junction, and the light emitting (i.e., junction) region may extend a moderate distance away from the depletion region of the p-n junction.

The first and second electrodes 12, 14 may be formed from a silicon layer 22 of a silicon-on-insulator (SOI) substrate. As depicted, a pre-purchased or pre-formed SOI substrate includes a substrate 18, an insulating layer 20, and the silicon layer 22. In an embodiment, one or both of the silicon layer 22 and the substrate 18 of the SOI substrate has (110) crystallographic orientation (i.e., crystallographic orientation plane (110)).

In other embodiments, the top layer 22 is selected from GaAs or InP, and the substrate 18 is selected from other semiconductor materials (e.g., GaAs), or insulating materials (e.g., sapphire or ceramic). If an insulating material is used for the substrate 18, the intermediate insulating layer 20 may be omitted. In some embodiments incorporating an insulating material as the substrate 18, it may be desirable to include the intermediate insulating layer 20 in order to reduce contamination.

While a silicon layer 22 is discussed in the following embodiments, it is to be understood that any suitable materials for substrate 18 and layers 20, 22 may also be used.

The electrodes 12, 14 may be formed by patterning (e.g., via photolithography) a desirable electrode design in the silicon layer 22, and etching (e.g., via dry etching, wet chemical etching, or combinations thereof) the silicon layer 22 to form the electrodes 12, 14. During formation of the electrodes 12, 14, each electrode 12, 14 may be doped with a dopant that is capable of introducing the first or second conductivity type. Dopants for achieving p-type conductivity in silicon include, but are not limited to boron, other like elements, or combinations thereof; and dopants for achieving n-type conductivity include, but are not limited to phosphorus, arsenic, antimony, other like elements, or combinations thereof. It is to be understood that other dopant species may be used to obtain p- and n-conductivity type in other semiconductor materials.

In one embodiment, the silicon layer 22 may be doped of a first conductivity type useful for one of the electrodes 12, 14. Both of the electrodes 12, 14 are formed from this layer 22. It is to be understood that the conductivity type of the second electrode 14, 12 may be converted to the second conductivity type before or after the second electrode 14, 12 is formed from layer 22. In an embodiment, the conductivity type may be converted by doping (e.g., via gas-phase doping, via diffusion from a dopant-containing oxide, or via ion implantation), by diffusion from a dopant-containing oxide, or by ion implantation. The first electrode 12, 14 may be protected by a masking material during the doping of the second electrode 14, 12, such that the first electrode 12, 14 retains its first conductivity type.

In another embodiment, the silicon layer 22 of the SOI substrate may be lightly doped, and dopant atoms of the first and second conductivity types may be added to the first and second electrodes 12, 14, respectively, while protecting the other electrode 14, 12 from the counter dopant.

In still another embodiment, one of the electrodes 12, 14 may be formed from the silicon layer 22 (of a first conductivity type) of the SOI substrate, and the other of the electrodes 14, 12 may be deposited on an insulating layer formed on the silicon layer 22 of the SOI substrate after the one electrode 12, 14 is formed from the silicon layer 22. It is to be understood that the insulating layer 20 of the SOI substrate may be laterally etched such that a portion of the first electrode 12, 14 and a portion of the second electrode 14, 12 bound a space empty of other material(s). The deposited electrode 14, 12 may be a semiconductor and may be doped with dopant atoms imparting a second conductivity type to the electrode 14, 12 either during or after deposition. In another embodiment, the deposited electrode 14, 12 may be formed of metal.

In yet a further embodiment, one of the electrodes 12, 14 may be formed from the silicon substrate 18 (of a first conductivity type) of the SOI substrate, and the other of the electrodes 14, 12 may be formed from the silicon layer 22 on the insulating layer 20 of the SOI substrate. The second electrode 14, 12 formed from the silicon layer 22 may be doped with dopant atoms imparting a second conductivity type to the electrode 14, 12 either during SOI substrate formation or after the second electrode 14, 12 is defined. The insulating layer 20 may be laterally etched such that a portion of the first electrode 12, 14 and a portion of the second electrode 14, 12 bound a space empty of other material(s).

Other examples of forming the electrodes 12, 14 are described in U.S. patent application Ser. No. 11/454,446, filed Jun. 16, 2006, which is incorporated herein by reference in its entirety.

The nanowire 16 positioned between the electrodes 12, 14 may be grown laterally or substantially vertically from one of the electrodes 12, 14, and connects or attaches to the other of the electrodes 14, 12. It is to be understood that the electrode 12, 14 surface from which nanowire 16 growth is initiated has (111) surface orientation (i.e., the growth surface of the electrode 12, 14 has a crystallographic orientation plane (111)), which enables growth in a typical <111> crystallographic orientation direction (i.e., perpendicular to the vertical or horizontal surface). It is to be understood that the crystallographic orientation of the growth initiating electrode 12, 14 surface and the attaching electrode 14, 12 surface may be the same or different. In some embodiments in which a lateral nanowire 16 is formed, the growth initiating and attaching surfaces (e.g., sidewalls) both have a crystallographic orientation plane (111). In other embodiments in which a vertical nanowire 16 is formed, the growth initiating and attaching surfaces may have different crystallographic orientations.

Nanowire 16 growth may be initiated and continued via a catalyst (e.g., gold, titanium, platinum, palladium, gallium, nickel, or combinations thereof) and a precursor gas. It is to be understood, however, that the nanowire 16 may be formed via any suitable method. A non-limitative example of forming a lateral nanowire 16 is described in U.S. patent application Ser. No. 10/738,176, filed on Dec. 17, 2003 (U.S. Publication No. 2005/0133476 A1, published Jun. 23, 2005), which is incorporated herein by reference in its entirety. Other example methods for forming lateral nanowires 16 are described in "Ultrahigh-density silicon nanobridges formed between two vertical silicon surfaces" by Islam et al., published in 2004 in Volume 15 of *Nanotechnology* at pages L5-L8; and "A novel interconnection technique for manufacturing nanowire devices" by Islam et al., published in 2005 in Volume 80 of *Appl. Phys. A* at pages 1133-1140, both of which are incorporated herein by reference. A non-limiting example of forming a substantially vertical nanowire 16 is further described in U.S. patent application Ser. No. 10/982,051, filed on Nov. 5, 2004 (U.S. Publication No. 2006/0097389, published May 11, 2006), incorporated herein by reference.

It is to be understood that nanowire 16 growth may be initiated from either of the first and second electrodes 12, 14, regardless of its conductivity type. In one embodiment, as the nanowire 16 grows, a first nanowire segment 24 is doped with a dopant that is capable of introducing the first or second conductivity type to the segment 24. Once the first segment 24 is grown to a desirable length, the dopant is changed to one that is capable of introducing the other of the second or first conductivity type to form the second segment 26 at the end of the first segment 24. In another embodiment, the nanowire 16 is grown via any suitable method, and respective dopants capable of introducing the first or second conductivity type are established in and/or on different portions of the nanowire 16 to form the segments 24, 26 (each having a different conductivity type). Generally, each of the nanowire segments 24, 26 is doped to have the same conductivity type as the electrode 12, 14 from which it is grown or to which it attaches. It is believed that the segments 24, 26 of different conductivity type along the length of the nanowire 16 form a region near the p-n junction with both high electron density and high hole density.

It is to be understood that the nanowire 16 is formed such that one or both of the segments 24, 26 includes a predetermined characteristic that affects the optical behavior of the junction region 28. When both of the segments 24, 26 have a predetermined characteristic, the predetermined characteristics of the respective segments 24, 26 may be the same or different. The predetermined characteristics are selected from bandgap, index of refraction, diameter, transmittance, absorbance, minority-carrier lifetime, band structure, radiative recombination ability (i.e., a material is capable of radiatively recombining injected electrons and holes), and/or combinations thereof. In an embodiment, at least one of the segments 24, 26 exhibits radiative recombination, which enables the generation of photons and light emission upon the recombination of electrons and holes at the junction region 28.

Generally, the materials exhibiting or having the predetermined characteristic(s) is/are selected such that light of a desirable wavelength is emitted from the junction region 28 when a voltage is applied to the nanowire 16.

In an embodiment, the nanowire 16 is a compound semiconductor, in which the nanowire segments 24, 26 are formed of direct bandgap materials, such as GaAs, $Ga_xAl_{1-x}As$, or InP. Such materials are capable of efficiently emitting photons without involving phonons. In other embodiments, materials which have indirect bandgaps when in bulk form may also be used to form the nanowire segments 24, 26. In the latter embodiment, however, it is believed that the dimensions of the nanowire 16 will be significantly smaller, such that the indirect bandgap materials will effectively behave like direct bandgap materials.

The nanowire segments 24, 26 may also be configured to have a diameter that affects one or more optical properties of the junction region 28. If the diameter is small enough, quantum confinement increases the energies of allowed states and, consequently, decreases the wavelength of the emitted light. In an embodiment, the nanowire 16 diameter is controlled by controlling the diameter of the catalyst nanoparticle used to grow the nanowire 16. It is to be understood, however, that the nanowire 16 diameter may also be controlled by controlling the pressure of the deposition ambient or other deposition conditions.

While some of the predetermined characteristics have been described hereinabove, these and other predetermined characteristics are further described in co-pending U.S. patent application Ser. No. 11/739,272, filed Apr. 24, 2007, incorporated herein by reference in its entirety.

In an embodiment of using the device 10, 10', a voltage is applied between the electrodes 12, 14 and across the nanowire 16. It is to be understood that the optical signal emitted may be modulated by applying a time varying voltage to the junction region 28. Electrons and holes injected across the junction region 28 recombine, and light is emitted from the nanowire 16. Generally, the light may be emitted at all angles. In some embodiments, collimation structures are used to direct the emitted light.

Referring specifically now to FIG. 2, an embodiment of the device 10 includes a reflective layer 30 established on a substrate surface 32 between the electrodes 12, 14. In the embodiment shown in FIG. 2, the insulating layer 20 of the SOI substrate is the substrate surface 32 upon which the reflective layer 30 is established. More generally, the substrate surface 32 upon which the reflective layer 30 is established is substantially parallel to the nanowire 16 and is positioned a spaced distance from the nanowire 16.

Non-limiting examples of suitable reflective materials for the layer 30 include insulators (e.g., silicon oxides (including SiO, $SiO_x$, $SiO_2$), $Si_3N_4$, $SiN_x$, $SiN_xH_y$, $Al_2O_3$, $TiO_2$, etc.), metals (e.g., Al, Au, Rh, Ag, Pt, Ni, Cu, etc.), semiconductors (e.g., Si, Ge, GaAs, AlGaAs (e.g., on a GaAs surface 20, 22), InGaAs (e.g., on a GaAs surface 20, 22), or SiGe (on a Si or Ge surface 20, 22)), or combinations thereof. When the layer 30 is transparent to the wavelength of the emitted light, the thickness of the layer 30 may be selected such that the reflection from the combination of the layer 30 and the underlying substrate/layers 18, 20 considered together is maximized.

The reflective layer 30 may be established via selective deposition processes such as atomic-layer deposition (ALD), and/or the like, or via non-selective deposition processes. In a selective deposition process, a mask or blocking layer may be used to coat any selected surfaces, in order to prevent deposition on such surfaces during deposition of the reflective layer 30 on the remaining un-masked surfaces. In some embodiments, a portion of the already present structure serves as at least a portion of the mask or blocking layer. In a non-selective deposition process, the reflective layer 30 is deposited on all exposed surfaces. Those surfaces upon which the reflective layer 30 is desirable are then protected by a masking layer, and any remaining unprotected portions of the reflective layer 30 are subsequently removed. Generally, the masking layer is then removed from the protected surfaces, which remain covered with the reflective layer 30.

It is believed that the reflective layer 30 advantageously aids in the efficient collection of the light emitted from the nanowire 16. A collector (not shown) may be operatively positioned to collect light that is reflected from the reflective layer 30, as well as to collect light that is emitted from the nanowire 16.

Referring specifically now to FIG. 3, another embodiment of the device 10' includes a non-linear optical material 34 established on the surface 36 of the nanowire 16, at least adjacent the junction 28. As shown in FIG. 3, the non-linear optical material 34 may also be established on the entire surface 36 of the nanowire 16. Techniques suitable for establishing the non-linear optical material 34 include chemical and/or physical vapor deposition techniques, for example, plasma-enhanced chemical vapor deposition, sputtering, laser ablation, and electron-beam evaporation.

The non-linear optical material 34 is selected such that it absorbs photons (e.g., those having a wavelength characteristic of the segment 24, 26 materials) that are emitted at or near the junction region 28, and emits photons of a different wavelength. It is to be understood that the non-linear optical material 34 may be selected to emit light of a desirable wavelength that does not correspond to the wavelength characteristic of the material forming the nanowire 16. As such, this embodiment of the device 10' may be used to emit light of an energy that may not otherwise be readily emitted using typical semiconductor materials. In some embodiments, the light emitted by the non-linear optical material 34 has a shorter wavelength than the light absorbed by the non-linear optical material 34, and in other embodiments, the light emitted by the non-linear optical material 34 has a longer wavelength than the light absorbed by the non-linear optical material 34. As non-limiting examples, the non-linear optical material 34 may be selected for an up-conversion of infrared light to visible light or for a down-conversion for correlated pair emission.

Non-limiting examples of suitable non-linear materials 34 include phosphor materials, barium titanate, beta barium borate, bismuth germinate, cadmium zinc telluride, cesium lithium borate, lithium niobate, lithium tantalate, lithium triborate, monopotassium phosphate, Nd:YAB (neodymium doped yttrium aluminum borate), Nd:YCOB (neodymium doped yttrium calcium oxyborate), nitrobenzene, potassium aluminum borate, potassium titanyl phosphate, tellurium dioxide, yttrium iron garnet, zinc telluride, or combinations thereof.

The devices 10, 10' described are suitable for use as light emitting diodes, photodetectors, optical modulators, optical isolators, and other optical and optoelectronic devices. The devices 10, 10' may be configured for off-chip optical interconnections via, for example, free-space or a wave-guide, for on-chip optical interconnections with other devices 10, 10' on the substrate, or for both on- and off-chip interconnections.

Figure 4:
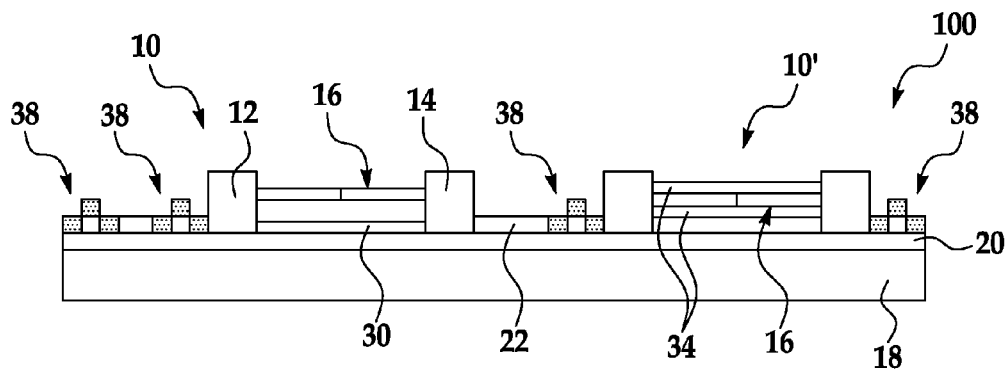
FIG. 4 is a schematic view of an embodiment of an optical system including embodiments of the optical device established on a silicon-on-insulator substrate.
Figure 5:
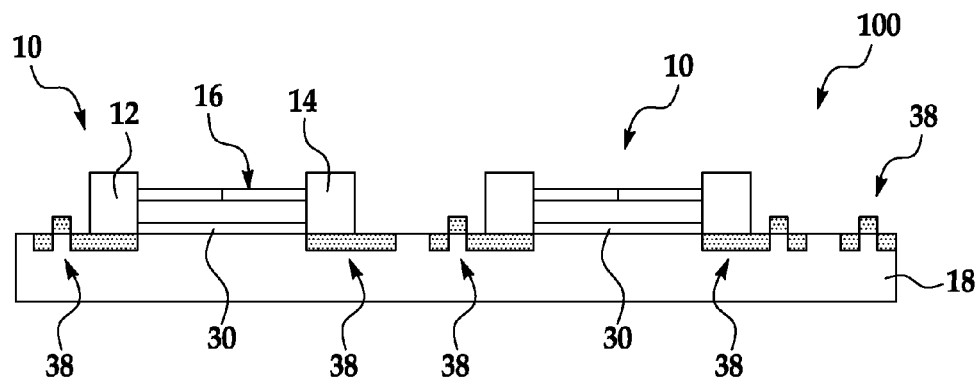
FIG. 5 is a schematic view of another embodiment of an optical system including embodiments of the optical device established on a single layered substrate.

FIGS. 4 and 5 depict optical systems 100 incorporating devices 10, 10' that are configured for on-chip optical interconnections. Each optical system 100 includes at least two optoelectronic devices 10, 10' that electrically connect electronics 38 integrated in and/or on the substrate. In embodiments including a bulk wafer or an SOI substrate, the electronics 38 may be integrated in the substrate. Non-limiting examples of suitable electronics 38 include complementary metal-oxide-semiconductors (CMOS).

FIG. 4 depicts the system 100 formed with an SOI substrate, and FIG. 5 depicts the system 100 formed on a single layered substrate, such as a silicon wafer. As a non-limiting example, one of the devices 10, 10' shown in FIGS. 4 and 5 may be an optical emitter, and the other device 10, 10' may be an optical detector.

Figure 6:
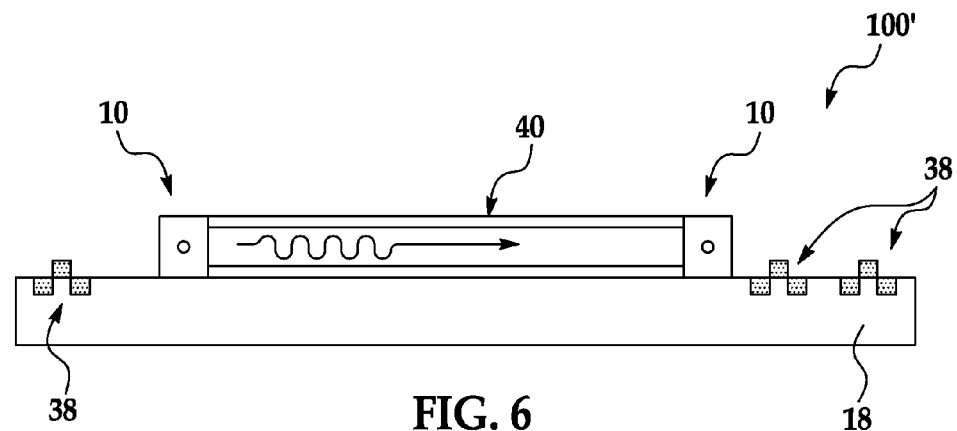
FIG. 6 is a schematic orthogonal view of still another embodiment of an optical system including embodiments of the optical device and a waveguide.

FIG. 6 depicts an orthogonal view of another optical system 100' including a waveguide 40 positioned between the devices 10, 10'. As previously stated, the waveguide 40 may be particularly suitable for off-chip optical interconnections. This embodiment of the system 100' also includes electronics 38 established in and/or on the substrate.

Embodiment(s) of the optical device, the method of making the optical device, and the optical system, as disclosed herein, advantageously include, but are not limited to the following advantages. A reflective layer 30 may be included which enhances light collection from the device 10. A non-linear optical material 34 may be included which enables photons of one wavelength to be absorbed and photons of another wavelength to be emitted. The optical devices 10, 10' disclosed herein may also advantageously be integrated with conventional silicon circuitry.

While several embodiments have been described in detail, it will be apparent to those skilled in the art that the disclosed embodiments may be modified. Therefore, the foregoing description is to be considered exemplary rather than limiting.

What is claimed is:

1. An optical device, comprising:
   a first electrode of a first conductivity type;
   a second electrode of a second conductivity type;
   a nanowire positioned laterally between the first and second electrodes, the nanowire having at least two segments and a junction region formed between the at least two segments, one of the at least two segments being one of grown from or attached to the first electrode and being of the first conductivity type, an other of the at least two segments being one of grown from or attached to the second electrode and being of the second conductivity type, and at least one of the at least two segments having a predetermined characteristic that affects optical behavior of the junction region;
   a substrate upon which the first and second electrodes are established or from which the first and second electrodes are formed, the substrate having a surface that is substantially parallel to the nanowire and is positioned a spaced distance from the nanowire; and
   a non-linear optical material covering the nanowire at least on the junction region.

2. The optical device as defined in claim 1, further comprising a reflective layer established on the substrate surface such that the entire reflective layer is positioned between the first and second electrodes, the reflective layer being a spaced distance from the nanowire.

3. The optical device as defined in claim 2 wherein the reflective layer is selected from oxides, nitrides, oxynitrides, metals, semiconductors, and combinations thereof.

4. The optical device as defined in claim 1, further comprising electronics integrated i) in, ii) on, or ii) combinations of in and on the substrate.

5. The optical device as defined in claim 1 wherein the non-linear optical material is selected from barium titanate, beta barium borate, bismuth germinate, cadmium zinc telluride, cesium lithium borate, lithium niobate, lithium tantalate, lithium triborate, monopotassium phosphate, neodymium doped yttrium aluminum borate, neodymium doped yttrium calcium oxyborate, nitrobenzene, potassium aluminum borate, potassium titanyl phosphate, tellurium dioxide, yttrium iron garnet, zinc telluride, or combinations thereof.

6. The optical device as defined in claim 1, further comprising electronics integrated on the substrate.

7. The optical device as defined in claim 1 wherein the predetermined characteristic is selected from band gap, index of refraction, diameter, transmittance, absorbance, minority-carrier lifetime, band structure, radiative recombination ability, and combinations thereof.

8. The optical device as defined in claim 1 wherein the first conductivity type is one of p-type and n-type, and wherein the second conductivity type is an other of n-type and p-type.

9. The optical device as defined in claim 1 wherein each of the first and second electrodes has a growth initiating surface which is a surface of the respective electrode, and wherein the growth initiating surface of the respective electrode has a crystallographic orientation plane (111).

10. The optical device as defined in claim 1 wherein the non-linear optical material covering the nanowire is spaced a distance from the substrate.

11. A method for using the optical device of claim 2, the method comprising:
   applying a voltage between the first and second electrodes, whereby electrons and holes recombine at or near the junction region, thereby emitting light;
   reflecting at least a portion of the emitted light via the reflective layer; and
   collecting the reflected light.

12. A method for using the optical device of claim 1, the method comprising:
   applying a voltage between the first and second electrodes, whereby electrons and holes recombine at or near the junction region, thereby emitting light of a first wavelength;
   absorbing, via the non-linear optical material, the light of the first wavelength; and
   emitting, from the non-linear optical material, light of a second wavelength.

13. The method as defined in claim 12 wherein the light of the second wavelength is shorter or longer than the light of the first wavelength.

14. A method for making an optical device, comprising:
   selecting, for at least one of a first nanowire segment or a second nanowire segment, at least one predetermined characteristic that affects optical behavior of a junction region formed between the first and second nanowire segments;
   laterally growing the first nanowire segment of a first conductivity type from a first electrode of the first conductivity type;
   laterally growing the second nanowire segment of a second conductivity type from the first nanowire segment such that the second nanowire segment attaches to a second electrode having the second conductivity type;
   establishing or forming the first and second electrodes on a silicon substrate, the silicon substrate having a surface that is substantially parallel to and positioned a spaced distance from the first and second nanowire segments; and
   covering at least the junction region of the nanowire with a non-linear optical material;
   whereby at least one of the first and second nanowire segments includes the at least one predetermined characteristic.

15. The method as defined in claim 14 wherein the predetermined characteristic is selected from band gap, index of refraction, diameter, transmittance, absorbance, minority-carrier lifetime, band structure, radiative recombination ability, and combinations thereof.

16. The method as defined in claim 14, further comprising integrating electronics i) in, ii) on, or ii) combinations of in and on the silicon substrate.

17. The method as defined in claim 14, further comprising establishing a reflective layer on the substrate surface such that the entire reflective layer is positioned between the first and second electrodes.

18. An optical system, comprising:
   a substrate;
   electronics integrated i) in, ii) on, or ii) combinations of in and on the substrate; and
   at least one light-emitting diode established on the substrate and in electrical communication with the integrated electronics, the light-emitting diode including:
      first and second electrodes, wherein the first electrode is of a first conductivity type, and the second electrode is of a second conductivity type;
      a nanowire laterally positioned between the first and second electrodes, the nanowire having at least two segments and a junction region formed between the at least two segments, one of the at least two segments one of grown from or attached to the first electrode and having the first conductivity type, an other of the at least two segments one of grown from or attached to the second electrode and having the second conductivity type, and at least one of the at least two segments having a predetermined characteristic that affects optical behavior of the junction region; and
      a non-linear optical material covering the nanowire at least on the junction region;
   wherein the substrate has a surface that is substantially parallel to and spaced from the nanowire.

19. The optical system as defined in claim 18, further comprising a reflective layer established on a surface of the substrate and positioned between the first and second electrodes, the reflective layer being substantially parallel to and a spaced distance from the nanowire.

* * * * *

UNITED STATES PATENT AND TRADEMARK OFFICE
CERTIFICATE OF CORRECTION

| | |
|---|---|
| PATENT NO. | : 8,154,127 B1 |
| APPLICATION NO. | : 11/829995 |
| DATED | : April 10, 2012 |
| INVENTOR(S) | : Theodore I. Kamins et al. |

It is certified that error appears in the above-identified patent and that said Letters Patent is hereby corrected as shown below:

In column 7, line 59, in Claim 4, delete "ii)" and insert -- iii) --, therefor.

In column 9, line 5, in Claim 16, delete "ii)" and insert -- iii) --, therefor.

In column 9, line 12, in Claim 18, delete "ii)" and insert -- iii) --, therefor.

Signed and Sealed this
Eighth Day of January, 2013

David J. Kappos
*Director of the United States Patent and Trademark Office*